United States Patent [19]
Soref et al.

[11] Patent Number: 5,548,128
[45] Date of Patent: Aug. 20, 1996

[54] DIRECT-GAP GERMANIUM-TIN MULTIPLE-QUANTUM-WELL ELECTRO-OPTICAL DEVICES ON SILICON OR GERMANIUM SUBSTRATES

[75] Inventors: Richard A. Soref, Newton Centre; Lionel Friedman, Holden, both of Mass.

[73] Assignee: The United States of America as represented by the Secretary of the Air Force, Washington, D.C.

[21] Appl. No.: 355,464

[22] Filed: Dec. 14, 1994

[51] Int. Cl.⁶ .................. H01L 29/06; H01L 33/00; H01L 31/0328; H01L 31/117
[52] U.S. Cl. .............. 257/18; 257/19; 257/103; 257/190; 257/201; 257/616
[58] Field of Search .................. 257/15, 18, 19, 257/103, 190, 200, 201, 433, 439, 616

[56] References Cited

U.S. PATENT DOCUMENTS

| | | | |
|---|---|---|---|
| 3,615,856 | 10/1971 | Sommers | 257/433 |
| 4,769,341 | 9/1988 | Luryi | 257/190 |
| 5,090,790 | 2/1992 | Zucker | 257/18 |
| 5,107,317 | 4/1992 | Takasaki | 357/30 |
| 5,107,538 | 4/1992 | Benton et al. | 385/130 |
| 5,173,913 | 12/1992 | Kaneno | 372/46 |
| 5,257,276 | 10/1993 | Forouhar et al. | 257/18 |

FOREIGN PATENT DOCUMENTS 61-294877  12/1986  Japan ................ 257/18

*Primary Examiner*—Mahshid Saadat
*Attorney, Agent, or Firm*—Robert L. Nathans

[57] ABSTRACT

Silicon-based laser diodes, optical amplifiers, electrooptical modulators, and photodetectors in which the active region consists of a pseudomorphic GeSn multiple quantum well stack. Each quantum well is tensile-strained $Ge_{1-x}Sn_x$ layer sandwiched between compressively strained barriers of $Ge_{1-y}Sn_y$ with $x\sim 0.1$, $x<y$ and $y\sim 0.15$. The GeSn quantum wells have a strain-induced direct gap for strongly allowed band-to-band transitions in the infrared range. The quantum well stack is grown upon a relaxed SiGeSn alloy buffer portion whose composition is graded up from a lattice match at the silicon substrate interface to a Ge or GeSn composition at buffer's top surface. Doped cladding layers are added, so that the devices have a p-i-n diode structure. The monolithic integrated Column IV devices have a rib waveguide structure, where desired, and operate typically in the 2 to 3 micron wavelength range.

25 Claims, 1 Drawing Sheet

DIRECT-GAP GERMANIUM-TIN MULTIPLE-QUANTUM-WELL ELECTRO-OPTICAL DEVICES ON SILICON OR GERMANIUM SUBSTRATES

STATEMENT OF GOVERNMENT INTEREST

The invention described herein may be manufactured and used by or for the Government for governmental purposes without the payment of any royalty thereon.

BACKGROUND OF THE INVENTION

This invention relates to monolithic integrated optical components made of Column IV alloys, particularly active, waveguided, electrooptical components that emit, amplify, modulate, or detect infrared light with high efficiency.

Monolithic integration on silicon requires that all components are constructed from elements or alloys in Column IV of the periodic table. For silicon-based monolithic optoelectronic components, such as the components interconnected on the opto-electronic superchip, efficient light emitters, especially laser diodes, and efficient modulators do not exist today, mainly because of the indirect bandgap of Si, of Ge, and of bulk Column IV alloys. In other words, "complete optical functionality" on a monolithic chip is prevented today by the lack of key photonic components. The indirect gap of prior-art materials means that the absorption edge of the material is broad. Also, indirectness prevents efficient recombination of electrons and holes across the gap (needed for strong luminesence).

There is a need to modify the band structure of Column IV materials so that optical transitions across the forbidden gap become strongly allowed, and so that the optical absorption spectrum becomes "sharp".

A temporary solution has been to go outside of Column IV for materials (to the III–V semiconductors, for example), and to join those materials to silicon. This "hybrid" approach to Si opto-electronics is the integration of various "non-IV" photonic components with silicon electronics by means of soldering, bonding, gluing, etc. However, the hybrid solution may not be satisfactory in the long run because the cost of hybrid chips may prove to be higher than that of monolithic chips. Monolithic integration of Column IV photonic alloys with Column IV electronics is expected to be very cost effective and reliable.

SUMMARY OF A PREFERRED EMBODIMENT OF THE INVENTION

The present invention overcomes the indirect gap problem and offers a cost-effective monolithic-integration solution to silicon-based opto-electronics. The invention uses the beneficial effects of strain in thin layers of coherently strained GeSn alloy to provide a direct gap between the conduction band and the valence band of the material. A set of these layers is fashioned into a multiple quantum well stack that "manipulates" infrared light efficiently with electrical control. The nano-layer stack is integrated monolithically on a silicon or germanium substrate. The laser diode (LD), light emitting diode (LED), optical amplifier (OA), and electrooptic modulator (EOM), constructed in accordance with the present invention, would operate typically in the 2 to 5 micron infrared range. The photodiode (PD) would operate typically in the 1 to 2 micron range.

DETAILED DESCRIPTION

The active material here is a germanium-tin alloy. Experiments have been reported in the literature where several percent of alpha-tin (as much as 25%) were incorporated in a germanium lattice by means of "epitaxial stabilization" which is a form of non-equilibrium growth. The growth techniques are chemical vapor deposition (CVD) and molecular beam epitaxy (MBE). The growth procedures are similar to those used for $Si_{1-x}Ge_x$ upon Si, thus the GeSn growth is expected to be quite feasible.

Let us consider a bulk, unstrained alloy of $Ge_{1-x}Sn_x$ rich in germanium. Let us also look at the conduction bands of this alloy at various points in the Brillouin zone. It is known that the L-valleys lie lower in energy than the $\Gamma$ minimum, i.e. the gap is indirect to L. However, the situation can be quite different in a strained-layer alloy compared to a bulk alloy.

In a recent publication (Soref and Friedman, "Direct Gap Ge/GeSn/Si and GeSn/Ge/Si Heterostructures" Superlattices and Microstructures (U.K.) vol. 14, no. 2/3, pp. 189–193, 1993) reasons are given to expect a crossover of the L and $\Gamma$ minima in the presence of tensile strain in the plane of the alloy film, with $\Gamma$ becoming lower in energy, i.e., the gap becomes direct at modest concentrations of tin. Studies of GeSn strained layers by Professors Dow and Ren at Arizona State University, show by computer simulation that a pseudomorphic, tensile 300 Å thick $Ge_{0.9}Sn_{0.1}$ quantum well has a direct gap (V1 to C1) when grown between 300 Å barriers of $Ge_{.85}Se_{.15}$. This theory supports the assertions in the aforesaid publication.

Figure 1:
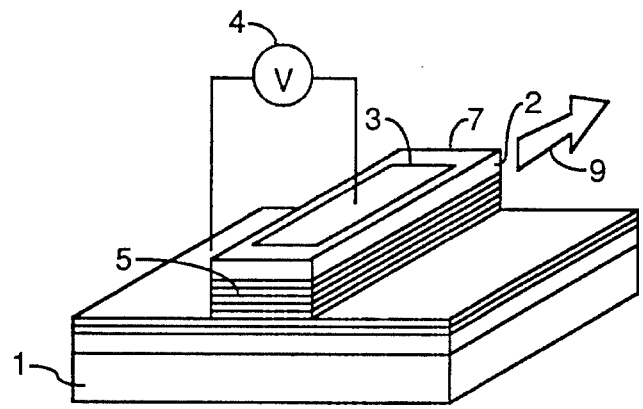
FIG. 1 is a pictorial representation of the Group IV quantum well laser device.
Figure 2:
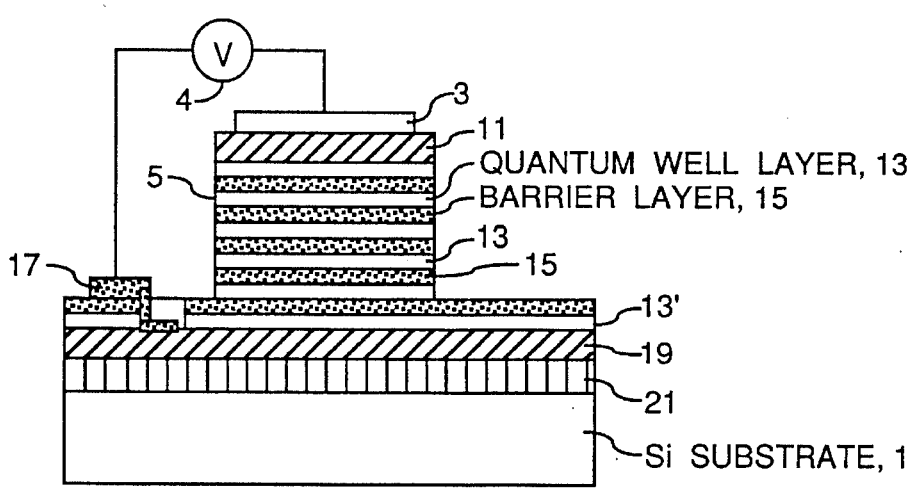
FIG. 2 is a cross-sectional view of the Group IV nano-layered structure, including p-i-n diode, rib waveguide, electrical contacts, quantum wells, buffer layers and substrate.

Referring now to FIGS. 1 and 2, a laser diode (LD) is supported by a Si or Ge substrate 1 and has a current source 4 connected to the LD via ohmic contact 3. Partially reflective end facets 5 and 7 are provided to permit the escape of light beam 9. The GeSn Quantum wells 13 are formed within the rib waveguide structure 2 which serves to laterally confine the light within the the rib. In FIG. 2, the stack of quantum well layers 13 are shown along with the interleaved barrier layers 15. A p-doped relaxed upper buffer layer 11 is positioned between first electrode ohmic contact 3 and the stack. Second electrode ohmic contact 17 completes the current path through the device. n-doped buffer layers 19 and 21 are positioned as shown in order to produce a good transition between the Si of substrate 1 and active QW layer 13' of the stack. The term "relaxed" means that the layer is strain-relieved, with good crystal quality at the top interface. The thickness of the relaxed layer is greater than the critical thickness for stable strain.

Theory indicates the multiple quantum well (MWQ) directness or direct gap will exist for a range of compositions: for example, 2% to 15% tin in the wells, with the barriers having a composition of 3% to 6% more tin than the percent Sn in the wells. The parameters in FIG. 2 are as follows: x is less than y; x is about 0.1 and z is about 0.5(x+y). These compositions produce barriers with a wider gap than the wells, and the strained layer superlattice is Type I. The GeSn tensile wells are tensile-strained in plane. There are two possibilities for strain in the barrier layers 15: unstrained, or compressively strained barriers. Usually, we prefer strain that is equal, but opposite sign, in the wells and barriers. This is called symmetric strain for the quantum well stack. In that case, the buffer layer upon which the MQW stack is grown should have a zincblende lattice parameter that is halfway between the lattice constant of the wells and the lattice constant of the barriers. Symmetric strain allows a thick high-quality stack to be grown. The thickness of individual layers is chosen to be less than the critical layer thickness for stable strain, which gives monocrystal layers with very few misfit dislocations per cm. sq.

We choose to call the MQW stack "pseudomorphic" because all layers are coherently strained with near-perfect crystal quality (low defect density).

The in-plane lattice size of the wells and barriers conforms to the lattice size of the buffer. Thus, the buffer's lattice size is "reproduced" throughout the stack. This is called commensurate growth or coherent strain. Strain is produced in the epitaxial layers by the mismatch between the buffer lattice parameter and the well-or-barrier lattice that would of existed in a bulk alloy crystal. The bulk lattice size is determined by the Ge/Sn ratio (the alloy composition).

The strain-relieved buffer under the stack can be constructed from a spatially varying (graded) composition alloy of SiGeSn. At the Si wafer, the buffer layer 21 is Si-like. At the top top surface of the buffer layer 19, the alloy is like GeSn, for example, $Ge_{.92}Sn_{0.08}$. This buffer is doped n-type, for example, to provide one portion of a p-i-n diode structure. Electrical contact is made to this buffer via electrode 17.

The upper buffer layer 11 can be p-doped, and the remaining intermediate layers of the stack are substantially undoped. However, the device can also be p-i-p or n-i-n if desired. It may be difficult technically to grade the composition of the SiGeSn lower buffer from pure silicon up to germanium-tin. In that case, two buffer layers can be grown upon the silicon substrate: for example, lower buffer layer 21 could be relaxed SiGe, with a composition that varied between pure Si and pure Ge; and lower buffer 19 would be a relaxed alloy of GeSn, whose composition varied from pure Ge to $Ge_{0.95}Sn_{0.05}$. Both lower buffers could be doped n-type.

At the top of the MQW stack, a second buffer is grown. This layer 11 would usually have a GeSn composition half way between that of the wells and the barriers, like $Ge_{0.92}Sn_{0.08}$. The upper buffer is doped p-type, for example, to construct the second portion of the p-i-n diode structure. Electrical contact is made to the upper buffer via electrode 3.

The upper and lower buffers have an index of refraction that is slightly lower than the "average index" of the MQW stack. Therefore, the buffers serve as optical claddings, and they will confine light vertically within the stack, i.e., they form a planar infrared waveguide. Lateral confinement of light (rib channel waveguiding) is obtained by etching a rib or ridge structure in the p-i-n MQW structure as shown in FIG. 1.

Figure 3:
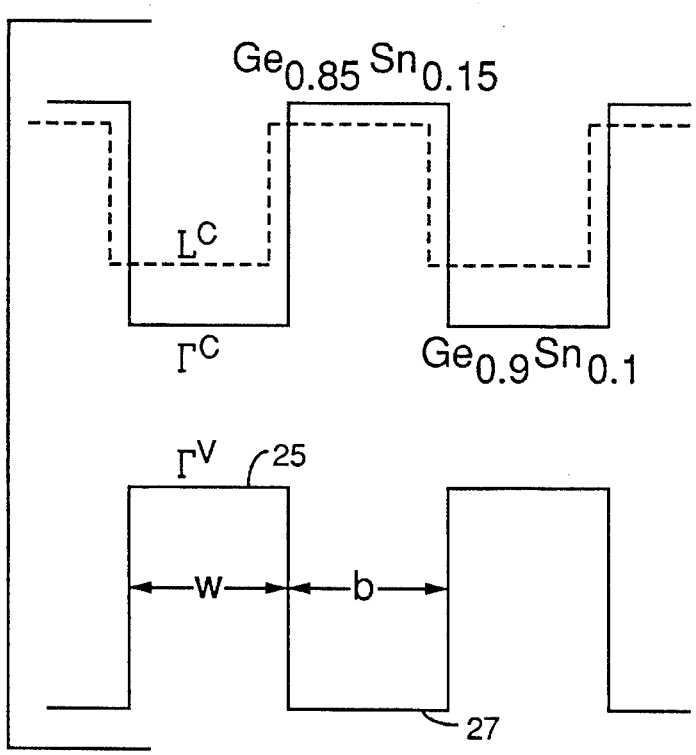
FIG. 3 is an energy-band diagram of the strained GeSn quantum well system showing the direct gap, band offsets and composition.

Reference is made to FIGS. 1–2 which depict the active region of an LD, LED, OA, EOM and PD. The LD in FIG. 1 has smooth vertical end facets that serve as optical mirrors in a Fabry Perot cavity. The LD structure is index waveguided. Distributed feedback could be used in lieu of the Fabry Perot if desired. The p-i-n diode would be operated forward biased for carrier injection in the LD. If the facets are anti-reflection coated, the FIG. 1 diode becomes an OA. If the facets are removed and the top contact is localized, the device becomes an LED, with the IR emission mainly waveguided in the rib. FIG. 3 shows the energy bands for the MQW stack (band-edge diagram, sub-bands not shown). Portion 25 relates to the well whereas portion 27 relates to the barrier. Each portion could have a typical width w which is about equal to b and which could be about 30 nm., making up a period of 60 nm. Twenty of such periods of well/barrier pairs could be employed within the stack.

When the p-i-n diode is reverse-biased by electrical energy source 4, carrier injection is minimized and a strong electric field is applied to the intrinsic MQW stack. In this case, the Electrical field E will modify the optical absorption curve of the MQW by the quantum confined Stark effect. Excitonic features will be present near the direct gap of the MQW absorption spectrum, and those features will shift and change size in the E field. Electroabsorption will be present in addition to electrorefraction. Hence, the reverse biased FIG. 1 device is a waveguided EOM. For modulation devices, it is also acceptable to use the same type of doping for the upper and lower buffer layers, thereby producing an n-i-n or p-i-p diode, which can function in a manner similar to p-i-n.

If photons are launched into the end of the FIG. 1 diode, many electron-hole pairs will be produced if the photon energy is higher than the direct gap energy, for example 0.7 to 0.9 eV photons. Then, if the diode is reverse biased, a photocurrent is collected, and the device serves as a PD with a high quantum efficiency.

While preferred embodiments have been described, others will become apparent to the workers in the art and thus the scope of the invention is to be limited solely by the terms of the following claims and art recognized equivalents thereto.

We claim:

1. A semiconductor optical device comprising:
   (a) an active region made up of a strained multiple quantum well stack having germanium-tin alloy quantum wells, and germanium-tin alloy barriers, said quantum well stack having given lattice constants, and wherein the quantum wells have an atomic percentage of tin of 5% to 15%, enabling a direct bandgap to exist between the n=1 conduction subband and the n=1 valence subband of the multiple quantum wells of said stack;
   (b) a doped lower buffer layer portion positioned below the stack and having a lattice constant close to the quantum well stack lattice constants;
   (c) a doped upper buffer layer portion positioned above the stack and having a lattice constant close to the quantum well stack lattice constants; and
   (d) a first electrode coupled to said upper buffer layer portion and a second electrode coupled to said lower buffer layer portion.

2. The optical device of claim 1 wherein the atomic percentage of tin in the upper and lower buffer layer portions contacting the stack is mid-way between the well and barrier percentages.

3. The optical device of claim 1 wherein the buffer layer portions have a lower refractive index than the well-barrier average index.

4. The optical device of claim 1 wherein a rib is etched into the multiple quantum well stack for lateral confinement of infrared light, thereby forming a channel waveguide.

5. The optical device of claim 1 wherein the upper and lower buffer layer portions are doped and the multiple quantum well stack is undoped.

6. The optical device of claim 5 wherein the upper and lower buffer layer portions are doped p and n respectively to form a p-i-n diode.

7. The optical device of claim 1 wherein the wells and barriers have thicknesses between 5 and 40 nm.

8. The optical device of claim 1 wherein said lower buffer layer portion is in contact with a substrate selected from the group consisting of Si and Ge.

9. The optical device of claim 1 wherein said wells are tensile strained in-plane.

10. The optical device of claims 9 wherein said lower buffer layer has a zincblende lattice constant that is halfway between the lattice constant of the wells and the lattice constant of the barriers.

11. The optical device of claim 9 wherein said lower buffer layer portion comprises a GeSn graded composition positioned below the stack, grown upon and contacting a substrate selected from the group consisting of Si and Ge;

12. The optical device of claim 1 wherein said wells are tensile strained in-plane and wherein said barriers have an atomic percentage of tin of 3% to 6% more than the percentage of tin in the quantum wells and are compressively strained in-plane for producing symmetric strain for the quantum well stack to enable a thick high quality stack to be formed.

13. The optical device of claims 12 wherein said lower buffer layer has a zincblende lattice constant that is halfway between the lattice constant of the wells and the lattice constant of the barriers.

14. The optical device of claim 13 wherein said lower buffer layer portion comprises a GeSn graded composition positioned below the stack, grown upon and contacting a substrate selected from the group consisting of Si and Ge.

15. The optical device of claims 1 wherein said lower buffer layer has a zincblende lattice constant that is halfway between the lattice constant of the wells and the lattice constant of the barriers.

16. A semiconductor optical device comprising:

(a) an active region made up of a multiple quantum well stack having in-plane tensile strained germanium-tin alloy quantum wells and germanium-tin alloy barriers, said quantum well stack having given lattice constants, and wherein the quantum wells have an atomic percentage of tin of 5% to 15%, enabling a direct bandgap to exist between the n=1 conduction subband and the n=1 valence subband of the multiple quantum wells of said stack and wherein said barriers have an atomic percentage of tin of 3% to 6% more than the percentage of tin in the quantum wells and are compressively strained in-plane for producing symmetric strain for the quantum well stack to enable a thick high quality stack to be formed;

(b) a doped relaxed SiGeSn graded composition lower buffer portion positioned below the stack, grown upon and contacting a substrate selected from the group consisting of Si and Ge;

(c) a doped relaxed GeSn composition upper buffer portion positioned above the stack, and wherein said upper and lower buffer layers each have a zincblend lattice constant that is halfway between the lattice constant of the wells and the lattice constant of the barriers; and (d) a first electrode coupled to said upper buffer layer portion and a second electrode coupled to said lower buffer layer portion.

17. The device of claim 16 wherein said quantum wells are tensile strained in-plane.

18. The optical device of claim 16 wherein the atomic percentage of tin in the upper and lower buffer layer portions contacting the stack is mid-way between the well and barrier percentages.

19. The optical device of claim 16 wherein the buffer layer portions have a lower refractive index than the well-barrier average index.

20. The optical device of claim 16 wherein a rib is etched into the multiple quantum well stack for lateral confinement of infrared light, thereby forming a channel waveguide.

21. The optical device of claim 16 wherein the upper and lower buffer layer portions are doped and the multiple quantum well stack is undoped.

22. The optical device of claim 21 wherein the upper and lower buffer layer portions are doped p and n respectively to form a p-i-n diode.

23. The optical device of claim 16 wherein the wells and barriers have thicknesses between 5 and 40 nm.

24. In an electro-optic semiconductor device, the improvement comprising an active region made up of a pseudomorphic multiple quantum well stack having tensile strained in-plane germanium-tin alloy quantum wells and germanium-tin alloy barriers, and wherein the quantum wells have an atomic percentage of tin of 5% to 15%, enabling a direct bandgap to exist between the n=1 conduction subband and the n=1 valence subband of the multiple quantum wells of said stack and wherein said barriers have an atomic percentage of tin of 3% to 6% more than the percentage of tin in the quantum wells and are compressively strained in-plane for producing symmetric strain for the quantum well stack to permit a thick high quality stack to be formed.

25. In an electro-optic semiconductor device, the improvement comprising an active region made up of a multiple quantum well stack having coherently strained germanium-tin alloy quantum wells, and germanium-tin alloy barriers, and wherein the quantum wells have an atomic percentage of tin of 5% to 15%, enabling a direct bandgap to exist between the n=1 conduction subband and the n=1 valence subband of the multiple quantum wells of said stack.

* * * * *